US008332783B2

(12) United States Patent
Seltmann et al.

(10) Patent No.: US 8,332,783 B2
(45) Date of Patent: Dec. 11, 2012

(54) CONTROL OF CRITICAL DIMENSIONS IN OPTICAL IMAGING PROCESSES FOR SEMICONDUCTOR PRODUCTION BY EXTRACTING IMAGING IMPERFECTIONS ON THE BASIS OF IMAGING TOOL SPECIFIC INTENSITY MEASUREMENTS AND SIMULATIONS

(75) Inventors: Rolf Seltmann, Dresden (DE); Stefan Roling, Dresden (DE); Francois Weisbuch, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 69 days.

(21) Appl. No.: 12/965,488

(22) Filed: Dec. 10, 2010

(65) Prior Publication Data
US 2012/0005634 A1 Jan. 5, 2012

(30) Foreign Application Priority Data

Jun. 30, 2010 (DE) .......................... 10 2010 030 758

(51) Int. Cl.
*G06F 17/50* (2006.01)
*G06K 9/00* (2006.01)
*G03F 1/00* (2012.01)
(52) U.S. Cl. ................. 716/51; 716/53; 382/144; 430/5
(58) Field of Classification Search ............. 716/50–56; 382/144–145; 430/5; 700/120–121
See application file for complete search history.

(56) References Cited

U.S. PATENT DOCUMENTS

| 5,650,854 | A | * | 7/1997 | Sugawara | ..................... 356/394 |
| 6,513,151 | B1 | * | 1/2003 | Erhardt et al. | ................... 716/51 |
| 6,539,331 | B1 | * | 3/2003 | Fiekowsky | ..................... 702/159 |
| 6,556,703 | B1 | * | 4/2003 | Kane et al. | ..................... 382/145 |
| 6,741,732 | B2 | * | 5/2004 | Yui | ............................... 382/144 |
| 6,828,542 | B2 | | 12/2004 | Ye et al. | ..................... 250/208.1 |
| 6,862,726 | B2 | * | 3/2005 | Futatsuya et al. | ............... 716/51 |
| 7,067,221 | B2 | * | 6/2006 | Mesuda et al. | ..................... 430/5 |
| 7,076,320 | B1 | * | 7/2006 | Phan et al. | ..................... 700/121 |
| 7,187,796 | B1 | * | 3/2007 | Phan et al. | ..................... 382/144 |
| 7,209,584 | B2 | * | 4/2007 | Tsuchiya et al. | ............... 382/145 |
| 7,367,010 | B2 | * | 4/2008 | Mesuda et al. | .................. 716/54 |
| 7,422,829 | B1 | * | 9/2008 | Babcock et al. | .................. 430/5 |
| 7,449,689 | B2 | * | 11/2008 | Nagatomo et al. | ............ 250/310 |
| 7,511,797 | B2 | * | 3/2009 | Van De Mast et al. | ......... 355/53 |
| 7,673,281 | B2 | * | 3/2010 | Yamanaka et al. | .............. 716/53 |
| 7,735,053 | B2 | * | 6/2010 | Harazaki | ......................... 716/53 |
| 7,761,178 | B2 | * | 7/2010 | Tian et al. | ..................... 700/97 |

(Continued)

OTHER PUBLICATIONS

Translation of Official Communication from German Patent Office for German Patent Application No. 10 2010 030 758.0 dated Mar. 29, 2011.

*Primary Examiner* — Stacy Whitmore
(74) *Attorney, Agent, or Firm* — Williams, Morgan & Amerson, P.C.

(57) ABSTRACT

Variations in critical dimensions of circuit features of sophisticated semiconductor devices may be reduced by efficiently extracting mask and/or imaging tool specific non-uniformities with high spatial resolution by using measured intensity values and simulated intensity values. For example, a tool internal radiation sensor may be used for measuring the intensity of an image of a lithography mask, while a simulated intensity enables eliminating the mask pattern specific intensity contributions. In this manner, high spatial resolution of the corresponding correction map may be obtained without undue effort in terms of man power and measurement tool resources.

20 Claims, 5 Drawing Sheets

U.S. PATENT DOCUMENTS

| | | | |
|---|---|---|---|
| 7,801,709 B2* | 9/2010 | Kawakami | 703/2 |
| 2002/0058188 A1* | 5/2002 | Iwasaki et al. | 430/5 |
| 2003/0213613 A1* | 11/2003 | Strozewski et al. | 174/250 |
| 2004/0025138 A1* | 2/2004 | Futatsuya et al. | 716/19 |
| 2004/0105577 A1* | 6/2004 | Wu et al. | 382/144 |
| 2004/0115541 A1* | 6/2004 | Yamaguchi et al. | 430/30 |
| 2004/0225993 A1* | 11/2004 | Taoka et al. | 716/21 |
| 2005/0172255 A1* | 8/2005 | Tsuchiya et al. | 716/19 |
| 2005/0273753 A1* | 12/2005 | Sezginer | 716/21 |
| 2006/0192936 A1 | 8/2006 | Schenau et al. | 355/69 |
| 2007/0032896 A1* | 2/2007 | Ye et al. | 700/108 |
| 2008/0003510 A1* | 1/2008 | Harazaki | 430/5 |
| 2008/0145769 A1* | 6/2008 | Kawakami | 430/5 |
| 2008/0175467 A1* | 7/2008 | Hong | 382/144 |
| 2008/0301623 A1* | 12/2008 | Tsai et al. | 716/21 |
| 2009/0045341 A1* | 2/2009 | McFarland et al. | 250/332 |
| 2009/0148780 A1* | 6/2009 | Yasuzato | 430/5 |
| 2009/0217233 A1* | 8/2009 | Mimotogi et al. | 716/21 |
| 2009/0319075 A1* | 12/2009 | Tian et al. | 700/121 |
| 2010/0123889 A1* | 5/2010 | Park et al. | 355/67 |
| 2011/0016437 A1* | 1/2011 | Scherubl et al. | 716/52 |
| 2011/0090329 A1* | 4/2011 | Poortinga et al. | 348/79 |

* cited by examiner

CONTROL OF CRITICAL DIMENSIONS IN OPTICAL IMAGING PROCESSES FOR SEMICONDUCTOR PRODUCTION BY EXTRACTING IMAGING IMPERFECTIONS ON THE BASIS OF IMAGING TOOL SPECIFIC INTENSITY MEASUREMENTS AND SIMULATIONS

BACKGROUND OF THE INVENTION

1. Field of the Invention

Generally, the present disclosure relates to the field of fabricating microstructures, such as integrated circuits, and, more particularly, to controlling critical dimensions (CD) in sophisticated imaging processes.

2. Description of the Related Art

The fabrication of microstructures, such as integrated circuits, requires tiny regions of precisely controlled size to be formed in one or more material layers of an appropriate substrate, such as a silicon substrate, a silicon-on-insulator (SOI) substrate or other suitable carrier materials. These tiny regions of precisely controlled size are generated by patterning the material layer by performing lithography, etch, implantation, deposition, oxidation processes and the like, wherein, typically, at least in a certain stage of the patterning process, a mask layer may be formed over the material layer(s) to be treated to define these tiny regions. Generally, a mask layer may consist of or may be formed by means of a layer of radiation sensitive material, such as photoresist, that is patterned by a lithographic process, typically a photolithography process. During the photolithography process, the radiation sensitive material or resist may be applied to the substrate surface and then selectively exposed to ultraviolet radiation through a corresponding lithography mask, such as a reticle, thereby imaging the reticle pattern into the resist layer to form a latent image therein. After developing the photoresist or any other radiation sensitive material, depending on the type of resist or radiation sensitive material used, positive resist or negative resist, the exposed portions or the non-exposed portions are removed to form the required pattern in the layer of photoresist or radiation sensitive material. Based on this resist pattern, actual device patterns may be formed by further manufacturing processes, such as etch, implantation, anneal processes and the like.

The immense progress in the field of semiconductor fabrication made over the last decades has been made possible essentially by the significant technical advance of the optical photolithography process technique, wherein significant progress in improving the resolution has led to a continuous reduction of critical features sizes, which are now well beyond 50 nm in sophisticated semiconductor devices. That is, an important factor in improving the resolution is the lithography process itself, in which patterns contained in a photomask or reticle are optically transferred to a substrate by means of an optical imaging system. Therefore, great efforts have been made to steadily improve the optical resolution of the imaging system, such as numerical aperture, depth of focus and wavelength of the light source used. As is well known, the resolution of an optical system is proportional to the wavelength of the light source used and to a process-related factor and is inversely proportional to the numerical aperture. For this reason, the wavelength may be reduced and/or the process-related factor may be reduced and/or the numerical aperture may be increased in an attempt to further improve the overall resolution. In recent decades, all three approaches have been concurrently taken, wherein, for instance, the exposure wavelength has been reduced from 436 to 365 nm and further to 248 nm towards 193 nm, which is the exposure wavelength currently used for critical lithography processes requiring critical dimensions that are well below the exposure wavelength. On the other hand, the depth of focus, i.e., the range within objects may be imaged with sufficient accuracy, is inversely proportional to the square of the numerical aperture so that significant efforts have also been made in this field. For example, starting with 0.25 in the early 1980's, the numerical aperture went up to 0.93 in 2004. In this situation, further improvements seemed difficult to be achieved until the technique of immersion photolithography was introduced and gave a new boost to further developments and increasing the numerical aperture above 1.0, wherein currently, via the steps of 1.07 and 1.2 in late 2007, a value of 1.35 has been achieved.

However, any further progress in reducing the exposure wavelength and/or increasing the numerical aperture may not be expected in the near future and, hence, any further reduction of the critical dimensions may require fully exploiting the capabilities of presently available complex lithography systems and associated process techniques. For example, even any subtle changes in the exposure dose within a single die region may result in a variance of the critical dimensions of several nanometers, which may no longer be acceptable in sophisticated semiconductor designs. Consequently, any critical factors, which may result in a variation of the critical dimensions, may have to be identified and appropriate corrective measures have to be taken in order to fully exploit the capabilities of presently available lithography techniques. For example, any non-uniformities of the imaging itself may be caused by certain imperfections during the manufacturing of the complex components, such as lens systems, illumination sources and the like. In advanced lithography tools, typically optical projection systems are provided which reduce the size of mask features formed in the reticle by a certain factor, for instance 5:1, 2:1 and the like, thereby providing significant advantages with respect to the quality of the masks, since the mask features may be formed on the basis of less critical dimensions. These projection systems typically comprise a plurality of lenses formed from two or more materials that may provide the desired transmission characteristics for the wavelength under consideration. Due to any imperfections during the manufacturing process, for instance with respect to the shaping of the individual lenses and due to imperfections in the materials used, however, a certain degree of deviation from an ideal imaging behavior is typically encountered, which may also be referred to as lens aberration. This non-ideal imagining behavior is typically quantitatively estimated after the manufacturing of the optical system and may also be monitored during the operation of the optical system, which may be accomplished by determining tool-specific characteristics, which quantitatively describe the discrepancy between an ideal wave front and the actual wave front of the imaging system under consideration. For this reason, a plurality of correction mechanisms are typically implemented into complex lithography systems, which may allow a certain re-adjustment of critical parameters, such as a correction of exposure dose and the like.

Also the lithography mask itself has been identified as a source of any non-uniformities during a complex lithography process, which may be caused by imperfections upon manufacturing a photomask. These imperfections may, for instance, be caused by imperfect materials and process techniques, while also a certain degree of degradation of the mask may occur over the lifetime of the photomask. For example, a plurality of degradation mechanisms have been identified, which may increasingly cause a non-uniform transmission, which may thus be superimposed with the basically non-uniform transmission caused by the specific pattern of mask features corresponding to a certain device level of a semiconductor device under consideration. That is, the very complex layout of modern semiconductor devices may result in complex patterns of circuit elements, wherein features of minimal dimensions, i.e., critical dimensions, may have to be provided with a certain density in some areas, while, in other areas, according to the layout of, for instance, a complex logic circuit, a different pattern density may have to be provided, which may generally result in a different global transmission behavior across the photomask, wherein, for instance, generally, a dense structure of mask features of critical dimensions may result in a reduced overall transmission, since a significant amount of light is lost due to the spatial filtering behavior of the lens aperture, when the mask features have dimensions at the resolution limit of the lens system.

Therefore, each imaging system may thus have its own fingerprint or signature due to the specific configuration of the imaging system and due to its individual imperfections in the illumination system and the lens systems of the lithography tool. Similarly, each lithography mask comprises a complex pattern of mask features, which, for instance, are typically formed on the basis of sophisticated correction techniques, such as OPC (Optical Proximity Correction) and the like, in order to correct pattern-specific deformations, which may occur in the actual resist features when performing a well-defined imaging process on the basis of a preselected imaging system. Consequently, in the OPC technique, the lithography process may be modeled with respect to a certain critical layout pattern for a given lithography process in order to appropriately redesign the critical mask features due to any predicted deformations of the basic layout that are predicted by the OPC model. Consequently, in addition to the complex pattern of mask features, which may include the OPC corrections, reticle-specific imperfections are typically convoluted over the pattern, thereby also imparting an individual fingerprint or signature to the photomask and the resist features obtained therefrom, which, in combination with the tool specific characteristics, may thus result in certain process non-uniformities, which may not be acceptable in very critical lithography processes that require, for instance, extremely uniform critical dimensions across the entire exposure field of the system. Furthermore, at least some of the factors contributing to the individual signatures of a mask/lithography tool pair may represent dynamic factors, so that corresponding correction strategies may have to be applied in a dynamic manner so as to maintain long-term stability of critical lithography processes. Consequently, in the last years, complex correction strategies have been developed in which a certain degree of correction may be applied in a controllable manner when performing critical lithography processes. For example, in some APC (Advanced Process Control) strategies, a sensitive adjustment of exposure dose values may be applied on the basis of measurement data obtained for each individual reticle/lithography tool combination, in order to take into account the associated signature.

Generally, the calculation of accurate correction functions requires the determination of the signature in a very precise manner in the first place. A frequently applied possibility to determine the signature of a lithography mask is to measure the critical dimensions of the mask features on mask level by appropriate SEM (Scanning Electron Microscopy) procedures. For this purpose, specifically designed test patterns of specific configuration are incorporated into the circuit layout, i.e., into the complex pattern of mask features, in order to determine mask-specific characteristics on the basis of the plurality of dedicated test patterns. For example, a plurality of mask patterns of the same configuration may be distributed over the entire area of the lithography mask and specific characteristics, such as lateral dimensions, material non-uniformities and the like, may be determined, wherein it is assumed that characteristics obtained from the distributed mask patterns may also appropriately represent any imperfections and non-uniformities in the actual circuit mask features. These well-established conventional strategies may thus provide information about discrete positions of the mask, however, without providing any information with respect to any non-uniformities that may be introduced by the exposure tool itself, i.e., by the lens system and the illumination system. Hence, upon establishing a correction function that is based on dedicated test patterns in the lithography mask, the tool-specific non-uniformities may not be taken into consideration. Moreover, due to the limited number of dedicated test patterns in the lithography mask, a corresponding map of the two-dimensional discrete function obtained on the basis of the test pattern may not necessarily represent the remaining mask areas with appropriate precision. For example, any high frequency variations, i.e., spatial high frequency variations, of real circuit patterns in the lithography mask are typically not included in the discrete two-dimensional function and any values interpolated therefrom. Hence, performance of the correction strategy based on discrete test patterns may be very limited. On the other hand, the measuring of real circuit patterns is, however, not a very promising approach, as these patterns are usually established on the basis of dedicated OPC models to correct each critical individual pattern in view of the limited optical transfer function of the lens of the imaging system under consideration. It is thus very difficult to differentiate between any "non-uniformities" introduced by the OPC correction and any other non-uniformities, which may be caused by other factors, such as manufacturing imperfections and the like.

Therefore, in other approaches, appropriate algorithms are being established for mask inspection tools in order to appropriately analyze the measurement data gathered during an inspection process in order to determine mask-specific non-uniformities. In a mask inspection process, typically, the lithography mask may be used during an imaging process, in which an appropriate light beam is passed through the mask and an appropriate imaging system, which will typically be configured so as to obtain the desired information, for instance with respect to transmission characteristics and the like, wherein, typically, the lens system and the illumination system may be optimized with respect to mask inspection processes and thus these components may differ from any such components in actual lithography tools, for instance in terms of exposure wavelength, numerical aperture and the like. Furthermore, it is quite questionable whether any such algorithms based on optical mask inspection data may enable a precise determination of the signature of the individual lithography masks, in particular if lithography masks for sophisticated logic circuitry are considered, in which significantly varying pattern densities and different sizes have to be implemented in a single lithography layer, for instance compared to layouts of memory devices, in which nearly identical patterns may be repeated many times. In particular, the reliability of any such algorithms may be inferior, since typically, as explained above, dedicated optical proximity corrections may be provided in a pattern-specific manner, wherein the optical "response" of the optical proximity correction may be specifically designed for well-defined imaging conditions of the photomask, which are not present in the optical inspection tool. In particular, any such algorithms based on the determination of the transmission characteristics may be heavily affected by the significant variance of pattern density and sizes of the mask features in combination with the dedicated optical proximity corrections. Furthermore, in these approaches, only the mask-specific non-uniformities are taken account of, while the lithography tool-specific imperfections are not included.

Accordingly, in other approaches, measurements on substrate basis may be performed by using SEM tools so that, in this case, performance of the lithography process, including mask non-uniformities, the signature of the lens distortion and the illumination of the lithography tool, is taken into consideration. On the other hand, the measurements are taken from specifically designed test patterns, as described above, and hence the authenticity of the measurement data may be inferior, since the characteristics of critical circuit patterns may not be appropriately reflected by the test patterns. It could be contemplated to obtain measurement values from thousands of actual circuit patterns, which, however, requires significant effort in terms of process time and inspection tool resources, thereby rendering this approach less attractive. Moreover, also in many cases, the critical dimensions and the local neighborhood of critical circuit patterns may significantly change in complex circuit patterns of logic circuitry, which may thus finally result in non-representative measurement results, which in turn may lead to an inappropriate correction function.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques and systems in which uniformity of imaging processes, such as lithography processes, mask inspection processes and the like, may be enhanced by efficiently determining measurement data of an imaging process, which may be compared with simulation data obtained by a simulation of the imaging process, wherein the measurement data and the simulation data may relate to intensity values of corresponding sub-areas of an image of a photomask with superior spatial coverage compared to conventional strategies. To this end, the high spatial coverage of the image of the lithography mask may be accomplished, for instance by scanning the entire image or exposure field of the imaging system under consideration, wherein the corresponding sub-areas are significantly less in lateral size compared to the entire exposure field, while at the same time a sufficient lateral size of these sub-areas may provide appropriately averaged intensity values, which may thus be independent from any critical dimensions which, however, may appropriately reflect the local transmission characteristics caused by the specific pattern of the lithography mask. That is to say, the intensity measurement values may be obtained with a sufficient spatial resolution so as to obtain a desired high spatial coverage of the exposure field under consideration, while at the same time the overall measurement time may be maintained within an acceptable range by selecting an appropriate size of the sub-areas, for instance with a lateral size of several micrometers to several hundred micrometers. Consequently, the measurement results and thus the mask-specific non-uniformities or the signature as well as the tool-specific non-uniformities or signature are contained in the measurement data. On the other hand, the simulation of the imaging process may be performed on the basis of well-established precise simulation strategies, so as to eliminate at least the influence of the pattern-specific transmission characteristics so that the comparison of the measurements data may be correlated with the combined signature of the lithography mask and the imaging tool, while, in other embodiments, the tool-specific features may also be taken into consideration by the simulation of the lithography process, thereby extracting the mask-specific imperfections. For example, the measurement data may be efficiently obtained on the basis of a tool-internal radiation sensor having an appropriate size to provide averaged intensity data within a reasonable measurement time.

One illustrative method disclosed herein comprises imaging a lithography mask with an exposure radiation on an image plane through an imaging optic of an imaging tool, wherein the lithography mask comprises a pattern of mask features that represents a pattern of device features of a semiconductor product to be formed in a die region. The method further comprises measuring an average intensity value for each of the plurality of image sub-areas of an image of the lithography mask that is formed in the image plane. The method additionally comprises generating a simulated averaged intensity value for the image, at least for each of the image sub-areas. Additionally, the method comprises generating correction data by comparing the measured average intensity values and the simulated averaged intensity values.

A further illustrative method disclosed herein relates to reducing variations of critical dimensions in optical imaging processes. The method comprises providing a radiation sensor in an image plane of an imaging tool. Moreover, the method comprises measuring an intensity of an exposure radiation of the imaging tool for a plurality of different positions in the image plane by performing an imaging process by passing the exposure radiation through a lithography mask and an optical imaging system and onto the radiation sensor. Additionally, the method comprises determining correction data for correcting at least a non-uniform imaging behavior caused by the lithography mask by comparing the measured intensity with a simulated intensity of the imaging process.

One illustrative optical imaging system disclosed herein comprises a radiation source and an optical transfer system that are configured to generate, in combination, an image of a lithography mask in an image plane of the optical imaging system. Moreover, the optical imaging system comprises a radiation sensor configured to be positioned in the image plane and to generate intensity measurements data for at least a plurality of sub-areas of the image. Moreover, the optical imaging system comprises an image simulation unit configured to generate simulated intensity values for the plurality of sub-areas of the image.

BRIEF DESCRIPTION OF THE DRAWINGS

The disclosure may be understood by reference to the following description taken in conjunction with the accompanying drawings, in which like reference numerals identify like elements, and in which.

Figure 1A:
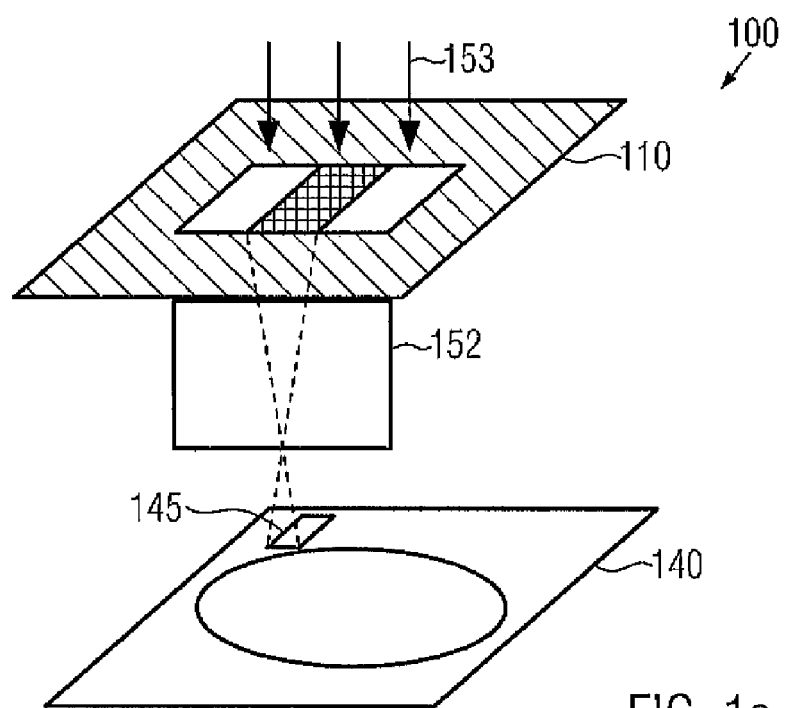
FIG. 1a schematically illustrates an imaging process performed on the basis of the lithography mask and a sensor mechanism for obtaining intensity values after imaging the lithography mask into an image plane, according to certain embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally addresses the problem of determining mask-specific and/or tool-specific non-uniformities or imperfections of an imaging process, such as lens distortion effects, illumination non-uniformities, mask placement errors and the like, which may also be referred to herein as fingerprint or signature of a corresponding lithography mask or lithography or imaging tool. To this end, measurement data may be obtained on the basis of an efficient measurement technique by providing intensity values of a radiation beam that has been passed through the lithography mask and an optical imaging system, wherein the measurement data provide a high spatial coverage of the lithography mask without requiring undue measurement times. To this end, the intensity of an image of the lithography mask may be determined by selecting a sufficient number of sub-areas, each of which may be represented by a single intensity value, which may be subsequently compared with a simulated intensity value in order to determine mask-specific and/or tool-specific non-uniformities. The lateral size of the sub-areas may be selected so as to obtain the desired spatial coverage without unduly long process times, while nevertheless "local" pattern-specific intensity variations may be resolved. That is, as discussed above, in complex layouts of circuit patterns, a significant change of transmission may be caused be a change of spatial frequency of patterns and/or by changes of the sizes of pattern features, wherein any such changes may occur within several tenths or hundredths of micrometers in a die region. Consequently, by selecting the lateral size of a corresponding sub-area in the above-specified range, a sufficient high spatial resolution may be achieved in order to obtain appropriate correction data for areas within the die, and thus the lithography mask, in which pattern-specific intensity variations may significantly affect the globally measured intensity.

In some illustrative embodiments disclosed herein, appropriate "average intensity" values for a sub-area of the image of the lithography mask may be obtained by a radiation sensor, which may be positioned in an "image plane," i.e., in the vicinity of a substrate holder of the imaging tool, wherein the radiation sensitive portion of the sensor may have an appropriate lateral size so as to comply with the above-specified constraints with respect to spatial resolution. For example, in many sophisticated lithography tools, typically, a radiation sensor may be provided under the substrate stage, which may be used to calibrate the dose sensors that are located above the lens system of the lithography tool. This sensor may also be used for measuring the intensity of the exposure radiation of a beam passing through the lithography mask and the optical system. In other cases, any other appropriate sensor may be positioned close to an appropriate plane, which will be referred to as image plane, in order to obtain a two-dimensional map of intensity values, wherein each sub-area may be appropriately dimensioned as to have a size that is significantly less than the lateral size of the actual image field of the imaging tool, which is, however, of appropriate size so as to obtain the measurement data within a desired time interval. For example, a typical sensor size may be selected from several ten micrometers to several hundred micrometers, such as approximately a hundred micrometers times hundred micrometers.

In other embodiments, appropriate sensors may be provided, which may have a moderately large sensitive area, which, however, may be partitioned into any appropriate sub-areas, for instance by combining appropriate pixels of the radiation sensor and the like. In other illustrative embodiments, sophisticated measurement techniques may be used for determining the material characteristics, such as the presence and the amount of a chemically modified portion of a radiation sensitive material on a substrate and the like. For example, measurement techniques performed on the basis of infrared radiation may be highly sensitive to chemical bonds and thus modifications of materials and may thus be efficiently used for determining an amount of a material having specific characteristics and the like. For instance, well-established Fourier transformed infrared spectroscopy (FTIR) may be applied, in which an appropriate infrared beam with a spatial resolution of several micrometers to several tenths of micrometers may be scanned across an exposed substrate area, while a measurement time of one to several seconds per measurement may be achieved. In this manner, a substrate, i.e., a radiation sensitive layer formed thereon, may be efficiently used as a "radiation sensor system" in some illustrative embodiments, thereby also contributing to very efficient process strategy for obtaining the desired intensity values.

On the other hand, the effect of lithography-specific characteristics on the image intensity obtained from the mask pattern may be efficiently simulated on the basis of well-established lithography simulation algorithms so that appropriate intensity values may also be determined by simulation and may then be used for comparing the simulated data with measurement data, in order to extract the effect of the mask- and/or tool-specific non-uniformities. From the extracted data, an appropriate correction map may then be established, which may be used for appropriately adjusting process parameters in an imaging process.

It should be appreciated that the principles disclosed herein may be advantageously applied to the lithography tools used for transferring a mask pattern into a radiation sensitive material formed on a substrate, thereby achieving superior yield of the lithography process, while, in other cases, the principles may also be applied to mask inspection tools and the corresponding imaging processes, thereby also providing superior performance.

FIG. 1a schematically illustrates an imagining process 100, which may be performed on the basis of a lithography mask 110 comprising a pattern of mask features as will be described in more detail with reference to FIG. 1b. Thus, the lithography mask 110 may represent the layout of a specific layer of a semiconductor device, which may have to be transferred into a radiation sensitive material in a specific manufacturing stage of the semiconductor device. Furthermore, as previously explained, if required, the mask 110 may comprise dedicated test patterns, which may be used for additional measurements, if required. The mask 110, i.e., the pattern contained therein, may be imaged into an image plane 140, which may be understood as a plane in which basically an image of the mask features may be obtained. Typically, the image plane 140 may be represented by the substrate holder, the substrate and the like. Thus, the image plane 140 may be understood as a physical plane, i.e., surface of an appropriate hardware component of an imaging tool, such as a substrate holder, a substrate and the like, and may also be understood as an imaginary plane, in which at least locally appropriate intensity data may be gathered, by temporarily positioning a sensor at an appropriate position within the plane 140. For example, a sensor or sensor system 145 may be provided within the image plane 140 so as to provide any appropriate signal or information indicating an intensity value associated to a specific lateral size of the sensor 145. For example, a lateral size of several micrometers to several hundred micrometers may be selected as a "sensitive" area of the sensor 145, to obtain a single intensity value for a sub-area. In this sense, the corresponding measurement result or intensity value may also be considered as an averaged intensity value.

Furthermore, a lens system 152 in combination with any appropriate illumination system 153 may be provided in the imaging process 100, which may represent an imaging process applied during a lithography process for generating resist features on a substrate on the basis of the mask 110, or which may represent an imaging process which may typically be applied during a mask inspection process, in which, for instance, transmission characteristics of the mask 110 may be examined. Consequently, the imaging process 110 may include any appropriate components well known in the art for effecting a scan motion, for instance by moving the mask 110 and/or any appropriate substrate holder and the like, so as to finally provide an image of the mask 110 within the image plane 140, thereby also "scanning" the sensor 145 across the entire image of the mask 110.

Figure 1B:
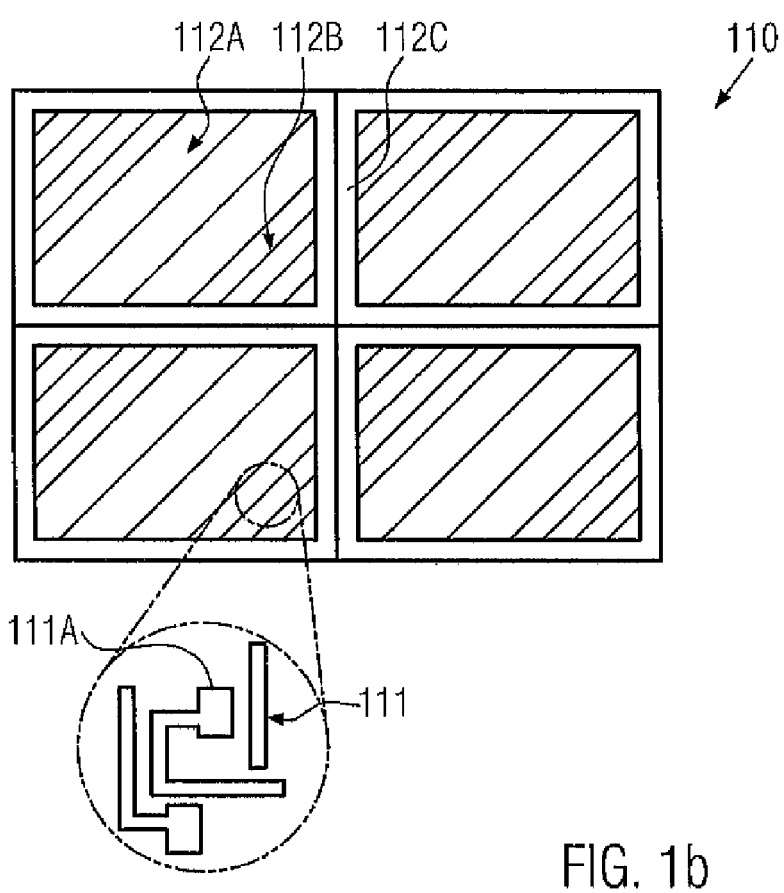
FIG. 1b schematically illustrates a top view of a lithography mask.

FIG. 1b schematically illustrates the mask 110, which may comprise areas 112A, 112B, 112C of varying pattern density, as required by the complex layout of circuit features of a complex semiconductor device. For example, corresponding mask features 111 may be provided with lateral dimensions, which may be close to the resolution limit of the lens system to be used for imaging the mask 110, which may generally result in a significant loss of light due to the spatial filtering behavior of the lens system 152 (FIG. 1a). Furthermore, as explained above, certain specific critical features of patterns may be formed by optical proximity corrections, as indicated by 111A, which may represent corresponding modifications of the basic geometric layout of the circuit features in order to compensate for lithography process specific characteristics.

Figure 1C:
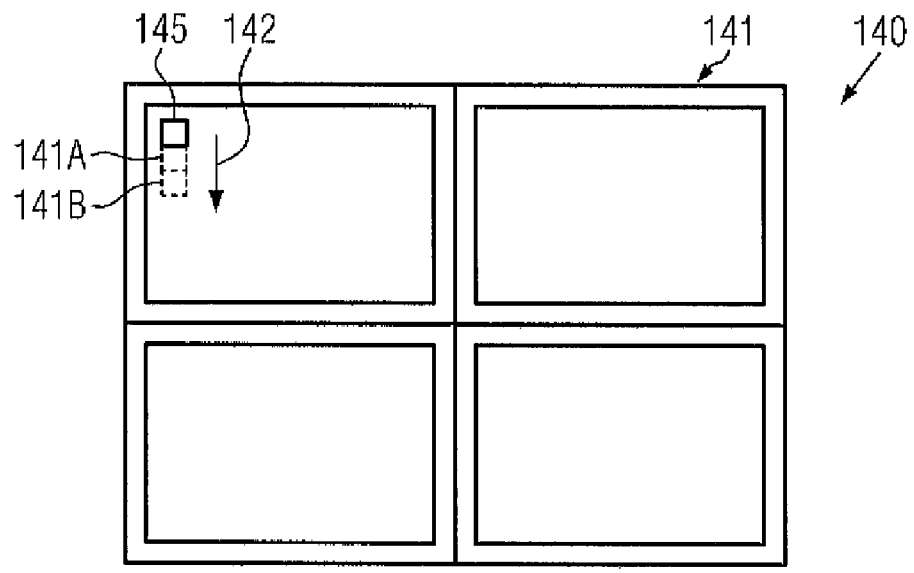
FIG. 1c schematically illustrates a top of view of the image plane including an appropriate radiation sensor, according to illustrative embodiments.

FIG. 1c schematically illustrates an image or exposure field 141, which may be obtained in the image plane 140 when performing the imaging process 100 of FIG. 1a. As illustrated, the image 141 may represent the complex pattern of the lithography mask 110 as shown in FIG. 1b, which may additionally include any mask-specific and tool-specific characteristics and thus may have encoded therein the "fingerprint" or signature of the mask 110 and the corresponding imaging tool used. Moreover, as illustrated, the sensor 145 may cover a certain sub-area of the image 141 and may be positioned at a plurality of sub-areas 141A, 141B by means of the appropriate scan motion 142. In some illustrative embodiments, the scan motion 142 may result in a complete coverage of the image 141, wherein the scan motion 142 may be performed in a step size manner or in a continuous manner, depending on hardware configurations and the like. For example, when applying a step-wise scan motion 142, in some illustrative embodiments, the step size may be selected so as to comply with the lateral size of the image sub-areas 141A, 141B, thereby achieving total spatial coverage with a minimum number of scan steps.

It should be appreciated that an appropriate scan motion may be accomplished on the basis of tool-internal hardware components, such as the hardware components that may typically be used for appropriately scanning the substrate when forming a plurality of images on a substrate.

Figure 1D:
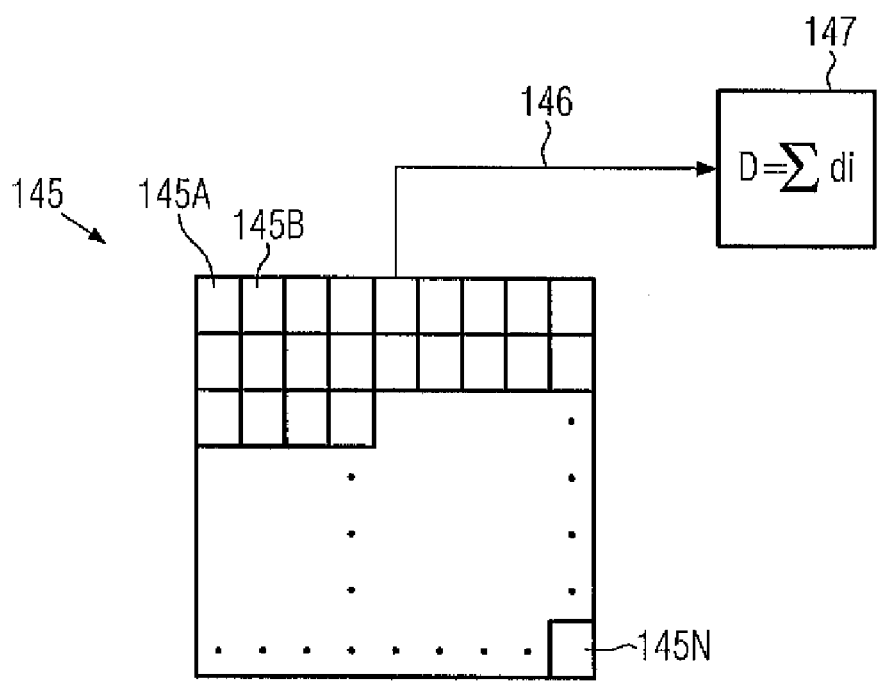
FIG. 1d schematically illustrates a sensor system for obtaining appropriate intensity values, according to illustrative embodiments.

FIG. 1d schematically illustrates the sensor 145 according to further illustrative embodiments, wherein the sensor may comprise a plurality of radiation sensitive areas 145A . . . 145N, which may cover at least a specific portion of the image 141 of FIG. 1c. In some illustrative embodiments, the signals of the sensor 145, as indicated by 146, may be obtained in such a manner that any required integration or averaging for the plurality of sensor portions 145A . . . 145N may be obtained. For example, if the various sensor areas 145A . . . 145N may be considered as "pixels," the corresponding pixel values may be added by a corresponding control circuit 147, thereby providing an integrated or averaged intensity value, while at the same time enabling the adaptation of the lateral size of a sub-area in the image 141, as shown in FIG. 1c. For example, when the pixels 145A . . . 145N have a lateral size of 1 micrometer by 1 micrometer, by adding the pixel values of hundred pixels, arranged as a square, a sub-area having a lateral size of 10 micrometers by 10 micrometers may be obtained, wherein the total number of pixel areas 145A . . . 145N determines the number of sub-areas, which may be measured concurrently without requiring an associated scan step. It should be appreciated that, in some illustrative embodiments, the sensor 145 may have appropriately dimensioned sub-areas, the number of which may be sufficient to cover the entire image 141, wherein any appropriate combination of pixels and thus any desired selection of sub-areas may be accomplished by means of the control circuit 147.

Figure 1E:
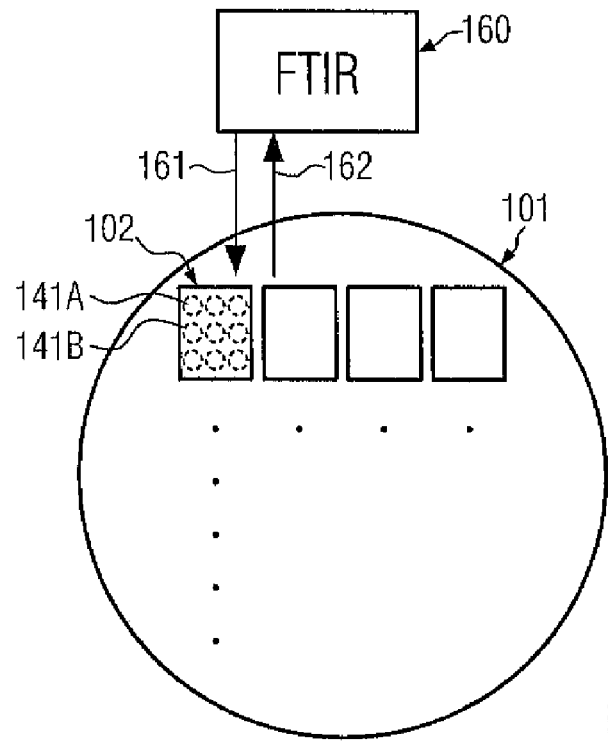
FIG. 1e schematically illustrates a system for obtaining appropriate intensity values from a substrate stage of an imaging system, wherein the intensity values may be obtained by Fourier transformed infrared spectroscopy measurement, according to the illustrative embodiments.

FIG. 1e schematically illustrates a further strategy of a sensor measurement system, such as a system 160, for obtaining appropriate measurement data indicating the transmission intensity of appropriately dimensioned sub-areas of an image of the lithography mask. To this end, the substrate 101 may be used as a radiation sensitive portion, which may comprise a radiation sensitive material, which may thus be exposed on the basis of the imaging process 100 as shown in FIG. 1a. Consequently, a plurality of die regions 102 may be defined on the basis of the imaging process, wherein one or more die regions 102 may be provided on the basis of a single exposure field or image, depending on the capability of the corresponding lithography system. On the basis of the latent images formed in the radiation sensitive material after exposing the substrate 101, as indicated by the die regions 102, or on the basis of a developed resist feature pattern, an appropriate measurement process may be performed so as to determine at least one material characteristic, which may be correlated with the radiation intensity deposited in the radiation sensitive material. For example, the chemical modification of the radiation sensitive material during the exposure may be efficiently detected by infrared measurement techniques, such as Fourier transformed infrared spectroscopy, in which an appropriately modulated beam of infrared radiation may be directed on a portion of the die region 102 with a defined angle of incidence, as indicated by 161, and a corresponding reflected beam 162 may be detected by the system 160, wherein the resulting spectra may then be analyzed, for instance, in a quantitative manner in order to determine locally the amount of material modified by the exposure, or generally in order to determine the amount of resist material which may have been preserved after the development of the latent images. It should be appreciated that FTIR measurement techniques are well established in the art and corresponding equipment is readily available in manufacturing environments for producing sophisticated semiconductor devices. Moreover, the beam spots may have any appropriate lateral size, for instance several micrometers to several tenths of micrometers, which may thus allow a time efficient scanning of one or more of the die regions 102 with a process time of several seconds to several tenths of seconds.

Consequently, during the imaging process 100 of FIG. 1a, a map of intensity values may be obtained for an image of the lithography mask 110 with a desired high spatial resolution so as to provide a desired fine spatial resolution of corresponding correction data, which may be obtained by further data manipulation on the basis of the measured intensity values.

Figure 1F:
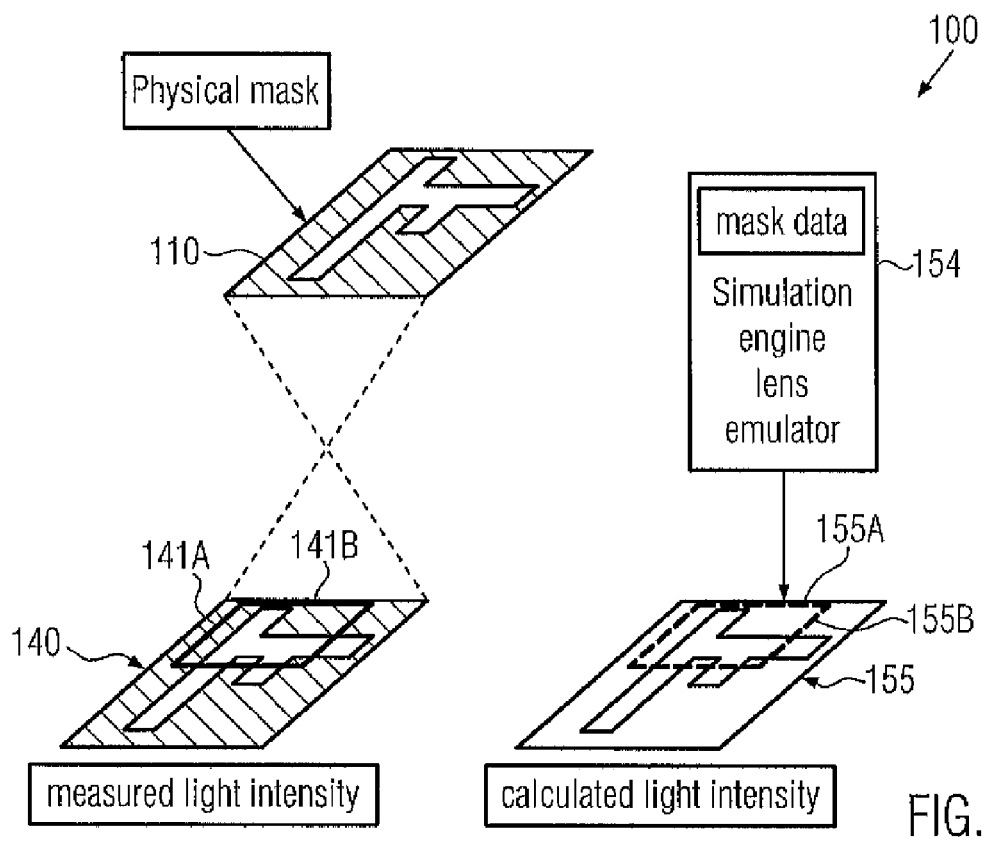
FIG. 1f schematically illustrates the imaging process in a further advanced manufacturing stage, in which a simulation of transmission values or intensity values may be performed, according to illustrative embodiments.

FIG. 1f schematically illustrates the imaging process 100 in a further advanced stage, in which a simulation mechanism 154 may be applied in order to determine appropriate intensity values for the plurality of image sub-areas, for at least some of which measured intensity values have also been obtained. As illustrated, the simulation engine 154 may be provided, for instance, on the basis of well-established mechanisms, and may have implemented therein a lens emulator in order to appropriately simulate the optical characteristics of the lens system and thus the intensity of mask pattern by computationally "imaging" the mask pattern by means of the emulated lens, wherein, however, in some illustrative embodiments, the lens specific fingerprint may not be implemented in the simulation. It should be appreciated that very precise lithography simulation engines are available and thus the corresponding intensity data may be obtained with a high degree of accuracy. Thus, the simulation data reflect the intensity values obtained for the mask pattern for a given general imaging process, if any other contributions, such as premeasured performance characteristics of the lens or illumination system, are not taken into consideration. Furthermore, the intensity data, indicated by 155, thus reflect the intensity values for any appropriate sub-areas, indicated by 155A, 155B, without considering any imperfections of the lithography mask itself. Furthermore, in some illustrative embodiments, the simulated image sub-areas 155A, 155B may correspond to the image sub-areas 141A, 141B in terms of position and lateral size, for which an associated intensity value has been obtained via the measurement procedure, as described above.

Thus, in some illustrative embodiments, the intensity values 155 may reflect the intensity of the individual image sub-areas without any mask and tool signatures, while, in other cases, when, for instance, tool-specific characteristics may be entered into the simulation engine 154, these tool-specific influences on the resulting intensity values may also be reflected by the simulated intensity values 155.

Figure 1G:
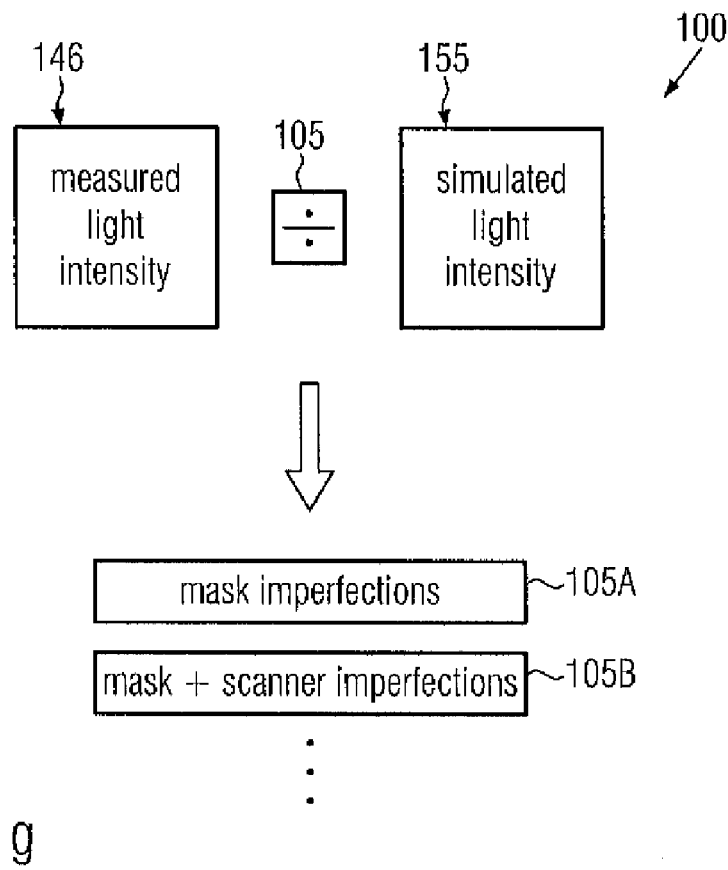
FIG. 1g schematically illustrates a process strategy for comparing measured intensity values and simulated intensity values in order to extract mask-specific and/or tool-specific signatures or imperfections, according to illustrative embodiments.

FIG. 1g schematically illustrates a mechanism of the process 100, in which a comparison 105 may be performed between the measured intensity values 146 and simulated intensity values 155. For example, due to the precise lithography simulation strategies available, in some illustrative embodiments, the associated intensity values may be compared by "subtracting" corresponding values 155 from the measured values 146, which may thus result in intensity values 105A, which may thus indicate any mask imperfections or with the mask signature, when the simulated intensity values 155 may also take into consideration any tool-specific characteristics. In other illustrative embodiments, the values 155 may be determined without any tool-specific characteristics and, hence, the difference of the values 146 and 155 may thus reflect the total contribution of the mask and the lithography or imaging tool, indicated as the values 105B. Consequently, by means of the comparison process 105, appropriate data may be obtained that indicate mask imperfections and/or mask and tool imperfections, wherein the data may be extracted with a spatial resolution that corresponds to the lateral size and number and position of the image sub-areas 141A, 141B (FIG. 1b).

Figure 1H:
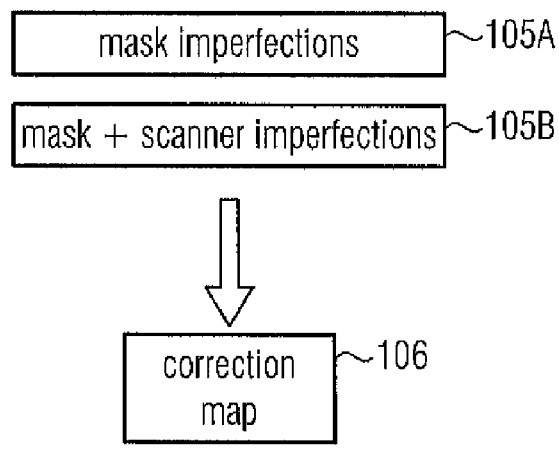
FIG. 1h schematically illustrates a mechanism for obtaining appropriate correction data usable for re-adjusting process parameters of a lithography process, according to illustrative embodiments.

FIG. 1h schematically illustrates the imaging process 100 according to further illustrative embodiments, in which one or both of the data sets 105A, 105B may be used for establishing a correction map, as indicated by 106, which may be applied to control an imaging process in order to reduce the non-uniformities of critical dimensions in actual semiconductor devices by appropriately adjusting the process parameters, such as exposure dose, lens aberration and the like. In other cases, the process of correcting the imaging process may include appropriate mask processing activities, in order to reduce the intensity non-uniformities on the basis of the correction map 106.

Figure 1I:
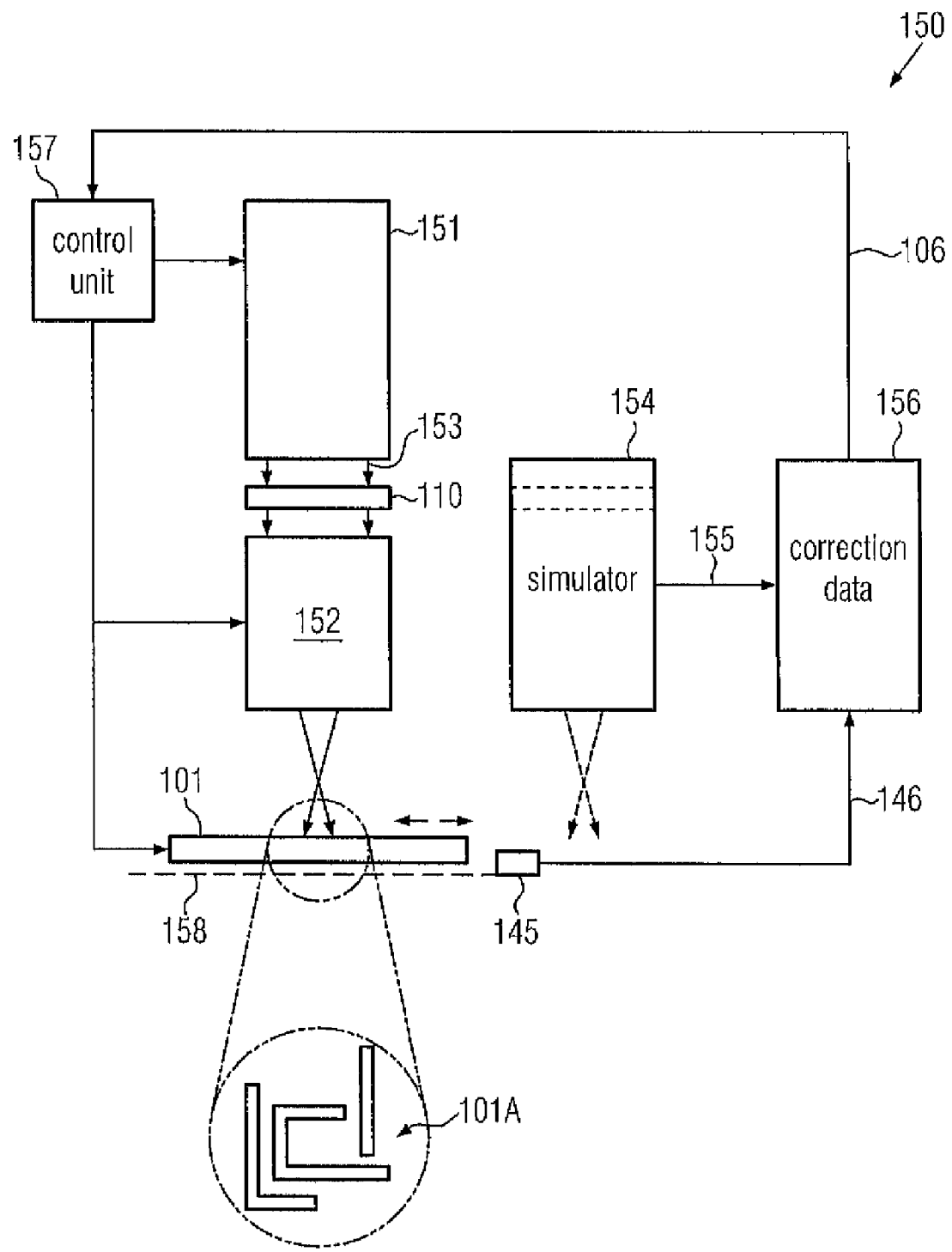
FIG. 1i schematically illustrates an imaging system having implemented therein a radiation sensor system and a simulator unit, in combination with a correction unit, based on the concept disclosed above according to illustrative embodiments.

FIG. 1i schematically illustrates an imaging system 150, which may represent a lithography system, a mask inspection system and the like. As shown, the imaging system 150 may comprise the radiation source 151 and the optical lens system 152, as is also previously explained with reference to FIG. 1a, a substrate stage 158 in order to receive one or more substrates, such as the substrate 101, if a lithography process is considered. Furthermore, as previously discussed, the system 150 may comprise the sensor 145, which may be appropriately positioned in the image plane of the system 150 in order to obtain measurement data, as is also discussed above. Furthermore, the system 150 may comprise the simulation engine 154, which may provide the simulation data 155 to a correction unit 156, which may also receive the measured intensity values 146 from the sensor 145. The simulation engine 154 may have implemented therein any appropriate simulation mechanism, as discussed above, in order to obtain the simulated data on the basis of the mask pattern data. Similarly, the correction data unit 156 may have implemented therein the comparison mechanism 105 as shown in FIG. 1g and may also be configured to establish the correction map 106, which may be applied to the control unit 157 of the system 150. The control unit 157 may be configured to control the various components, such as the radiation source 151, the lens system 152, the substrate stage 158, for instance on the basis of advanced APC strategies, in order to maintain a process output close to a target value. Moreover, the control unit 157 may receive the correction data map 106, which may thus be used for compensating for or at least significantly reducing any contributions caused by mask-specific non-uniformities and/or tool-specific non-uniformities as discussed above. To this end, appropriate control mechanisms may be implemented in the control unit 157, for instance dose control mechanisms, mechanisms for adjusting lens aberration and the like.

Consequently, upon operating the system 150 at any appropriate stage, the lithography mask 110 may be imaged on the sensor 145 in order to generate appropriate intensity values 146, while the simulation engine 154 may provide the simulated data 155. It should be appreciated that the simulation engine 154 may be activated at any appropriate time, which may not necessarily be correlated with the time of obtaining the measured intensity values 146. Thus, based on the measurement values 146, an updated correction data map 106 may be established, for instance in order to account for any dynamic mask degradation effects and the like, and the map 106 may thus be used for appropriately controlling the imaging process in the system 150, thereby obtaining the resist features 101A with superior uniformity.

In other cases, the system 150 may represent a mask inspection tool, in which the simulation engine 154 may be operated so as to also include tool-specific characteristics, in order to obtain the simulation data 155 so as to reflect the pattern-specific and tool-specific influences on the finally obtained intensity, thereby allowing extracting the mask-specific non-uniformities with a high degree of precision on the basis of a desired high spatial resolution. It should be appreciated that the correction data map may also be used for any mask post-processing in order to correct for mask and/or tool imperfections that are reflected by the correction data map.

As a result, the present disclosure provides imaging systems in which mask specific and/or tool specific characteristics of an imaging system and of a lithography mask may be extracted with high spatial resolution on the basis of efficient measurement techniques, for instance based on tool-internal sensors, in combination with well-established precise simulation processes, thereby enabling superior uniformity of critical imaging processes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
imaging a lithography mask with an exposure radiation on an image plane through an imaging optic of an imaging tool, said lithography mask comprising a pattern of mask features that represent a pattern of device features of a semiconductor product to be formed in a die region;
measuring an averaged intensity value for each of at least a plurality of image sub-areas of an image of said lithography mask that is formed in said image plane, wherein each image sub-area is measured by a subset of pixels of a radiation sensitive sensor portion such that the number of pixels in the subset is less than a total number of pixels of the radiation sensitive sensor portion;
generating a simulated averaged intensity value for said image at least for each of said image sub-areas; and
generating correction data by comparing said measured averaged intensity values and said simulated averaged intensity values.

2. The method of claim 1, wherein a lateral size of each of said plurality of image sub-areas is less than a lateral size of said image in said image plane and within a range of about 30 μm to about 500 μm.

3. The method of claim 2, wherein said lateral size is determined by lateral dimensions that are less than approximately 200 μm.

4. The method of claim 1, wherein measuring said averaged intensity value for each of said plurality of image sub-areas comprises obtaining electrical data from a radiation sensor positioned in said image plane.

5. The method of claim 4, wherein obtaining said electrical data comprises positioning a radiation sensitive sensor portion in said image plane and scanning said radiation sensitive sensor portion across said image so as to cover at least said plurality of sub-areas.

6. The method of claim 5, wherein said radiation sensitive sensor portion is scanned step-wise with a step size that is equal to or greater than the lateral size of said radiation sensitive sensor portion.

7. The method of claim 5, wherein said radiation sensitive sensor portion is scanned in a substantially continuous scan motion.

8. The method of claim 4, wherein said radiation sensor comprises a plurality of said radiation sensitive sensor portions, wherein at least a respective one of said plurality of said radiation sensitive sensor portions is positioned in each of said plurality of image sub-areas.

9. The method of claim 1, wherein measuring said averaged intensity value for each of a plurality of image sub-areas comprises forming said image in a material layer provided on a substrate that is positioned in said image plane and determining at least one material characteristic as an averaged material characteristic at least in each of said image sub-areas.

10. The method of claim 9, wherein determining said at least one material characteristic comprises performing an infrared analysis process at least on each of said plurality of image sub-areas.

11. The method of claim 1, further comprising forming said image in a radiation sensitive material of at least one substrate by using said correction data for adjusting an exposure dose.

12. The method of claim 1, wherein generating a simulated averaged intensity value for at least each of said plurality of image sub-areas comprises using pattern-related information of said pattern of mask features at least for mask portions that correspond to said plurality of image sub-areas.

13. The method of claim 12, wherein generating a simulated averaged intensity value for at least each of said plurality of image sub-areas further comprises using one or more measured characteristics of said imaging tool.

14. The method of claim 1, wherein said imaging tool is a lithography tool for forming said image on product substrates comprising a plurality of die regions.

15. The method of claim 1, wherein said imaging tool is a mask inspection tool.

16. A method of reducing variations of critical dimensions in optical lithography processes, the method comprising:
  providing a radiation sensor in an image plane of an imaging tool, said radiation sensor comprising a plurality of radiation sensitive pixels;
  measuring an intensity of an exposure radiation of said imaging tool for a plurality of different positions in the image plane by performing an imaging process by passing said exposure radiation through a lithography mask and an optical imaging system and onto said radiation sensor, wherein the intensity of at least one of the plurality of different positions is measured by a subset of said radiation sensitive pixels that is less than a total number of said radiation sensitive pixels of the radiation sensor; and
  determining correction data for correcting at least a non-uniform imaging behavior caused by said lithography mask by comparing said measured intensity with a simulated intensity of said imaging process.

17. The method of claim 16, wherein measuring said intensity comprises scanning said radiation sensor across a portion of said image plane that comprises an image of said lithography mask upon performing said imaging process.

18. The method of claim 16, further comprising applying said correction data when forming an image of said lithography mask in a radiation sensitive material layer formed on a substrate.

19. An optical imaging system comprising:
  a radiation source and an optical transfer system that are configured in combination to generate an image of a lithography mask in an image plane;
  a radiation sensor configured to be positioned in said image plane and to generate intensity measurement data for at least a plurality of sub-areas of said image, wherein the intensity measurement data is measured by a subset of radiation sensitive pixels on the radiation sensor that is less than a total number of said radiation sensitive pixels of the radiation sensor; and
  an image simulation unit configured to generate simulated intensity values for said plurality of sub-areas of said image.

20. The imaging system of claim 19, wherein said radiation sensor is configured to provide a spatial resolution that is less than a critical dimension of features in said image and greater than a lateral size of said image.

* * * * *